United States Patent
Apelgren et al.

(10) Patent No.: US 6,315,637 B1
(45) Date of Patent: Nov. 13, 2001

(54) PHOTORESIST REMOVAL USING A POLISHING TOOL

(75) Inventors: Eric M. Apelgren, Austin, TX (US); Jonathan B. Smith, Fremont, CA (US); Paul R. Besser, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/484,601

(22) Filed: Jan. 18, 2000

(51) Int. Cl.[7] .................................................... B24B 1/00
(52) U.S. Cl. ................................ 451/30; 451/41; 451/54
(58) Field of Search ................................ 451/29, 30, 41, 451/54, 59, 63; 438/690, 691, 692, 693

(56) References Cited

U.S. PATENT DOCUMENTS

| 5,688,360 | * | 11/1997 | Jairath | 156/345 |
| 5,718,618 | * | 2/1998 | Guckel et al. | 451/41 |
| 6,010,962 | * | 1/2000 | Liu et al. | 438/687 |
| 6,174,769 | * | 1/2001 | Lou | 438/253 |

* cited by examiner

*Primary Examiner*—Timothy V. Eley
(74) *Attorney, Agent, or Firm*—Williams, Morgan & Amerson, P.C.

(57) ABSTRACT

The present invention is directed to semiconductor processing operations. In one illustrative embodiment, the invention comprises providing a wafer having a layer of photoresist formed thereabove, positioning the layer of photoresist in contact with a polishing pad or a polishing tool, and rotating at least one of the wafer and the polishing pad to remove substantially all of the layers of photoresist.

17 Claims, 5 Drawing Sheets

PHOTORESIST REMOVAL USING A POLISHING TOOL

BACKGROUND OF THE INVENTION

1. Field of the Invention

The present invention is generally directed to semiconductor processing, and, more particularly, to a method of removing a layer of photoresist using a polishing tool.

2. Description of the Related Art

A conventional integrated circuit device, such as a microprocessor, is typically comprised of many thousands of semiconductor devices, e.g., transistors, formed above the surface of a semiconducting substrate. For the integrated circuit device to function, the transistors must be electrically connected to one another through conductive interconnections.

Many modern integrated circuit devices are very densely packed, i.e., there is very little space between the transistors formed above the substrate. Thus, these conductive interconnections must be made in multiple layers to conserve plot space on the semiconducting substrate. This is typically accomplished through the formation of a plurality of conductive lines and conductive plugs formed in alternative layers of dielectric materials formed on the device. The conductive plugs are means by which various layers of conductive lines, and/or semiconductor devices, may be electrically coupled to one another. This interconnected network of contacts and lines allows electrical signals to propagate throughout the integrated circuit device. The conductive lines and plugs may be made of a variety of conductive materials, such as copper, aluminum, aluminum alloys, titanium, tantalum, titanium nitride, tantalum nitride, tungsten, etc. These conductive lines and plugs may be formed by a variety of known techniques, e.g., single damascene processing, dual damascene processing, etc.

The openings in the layer of dielectric material for the conductive interconnections may be formed by performing known photolithography and etching process. In general, photolithography is a process in which a layer of photoresist, a material whose structure may be changed upon exposure to a light source, is formed above a layer of dielectric material in which it is desired to form openings for a conductive interconnection, e.g., a line or plug. Essentially, the image that is desired to ultimately be formed in the underlying process layer will first be formed in the layer of photoresist by exposing portions of the photoresist layer to an appropriate light source. Following development of the photoresist layer, the portions of the photoresist layer exposed to the light source will be resistant to subsequent etching processes to be performed on the semiconductor device. The desired features of the semiconductor device are then formed in the underlying layer by performing one or more wet or dry etching processes to remove the portions of underlying dielectric layer that are not protected by the patterned layer of photoresist.

As these conductive interconnections have become more densely packed together, the capacitance that may exist between adjacent conductive interconnections has also become an important consideration. Increased capacitance between adjacent conductors is undesirable because it may delay signal propagation along the conductors, and it may result in increased power consumption by an integrated circuit device, as this capacitance must be charged-up during each operating cycle. As the capacitance of two conductors is inversely proportional to the distance between the conductors, reducing the device dimensions inevitably leads to an increase of the stray capacitance of adjacent conductors.

In an effort to reduce the capacitance between adjacent conductive interconnections, the dielectric materials in which the conductive interconnections will be formed have been made from materials having relatively low dielectric constants ("k"). However, care must be taken when using such materials because such low-k materials may not be stable enough to withstand subsequent processing, e.g., wet etching processes, ashing processes, etc. In particular, removing the layer of photoresist after the openings for the conductive inter-connections have been formed in the layer of dielectric material may be problematic given the nature and instability of the low-k dielectric materials used in modem device fabrication. For example, ashing processes used to remove the layer of photoresist may also damage the layer of dielectric material.

The present invention is directed to overcoming, or at least reducing the effects of, one or more of the problems set forth above.

SUMMARY OF THE INVENTION

The present invention is directed to semiconductor processing operations. In one illustrative embodiment, the invention comprises providing a wafer having a layer of photoresist formed thereabove, positioning the layer of photoresist into contact with a polishing pad of a polishing tool, and rotating at least one of the wafer and the polishing pad to remove substantially all of the layers of photoresist.

BRIEF DESCRIPTION OF THE DRAWINGS

The invention may be understood by reference to the following description taken in conjunction with the accompanying drawings, in which like reference numerals identify like elements, and in which.

Figure 1:
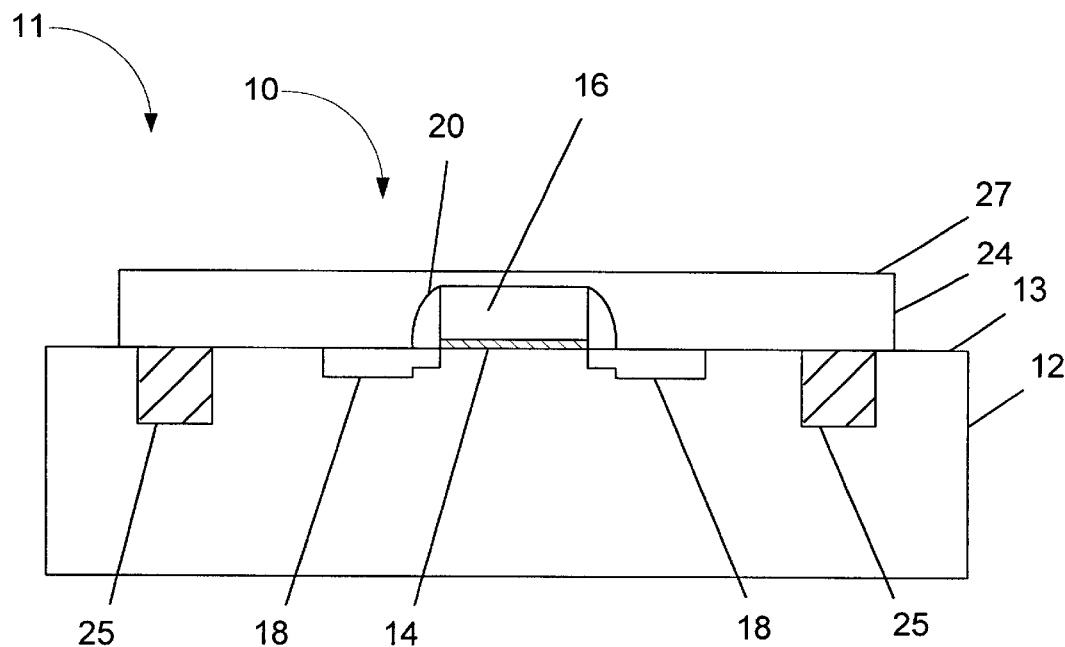
FIG. 1 is a cross-sectional view of an illustrative semiconductor device.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention is directed to a method and apparatus for determining endpoint of a semiconductor polishing process. In disclosing the present invention, reference will be made to FIGS. 1–7. The relative sizes of the various features depicted in the drawings may be exaggerated or reduced as compared to the size of those feature sizes on actual devices. Nevertheless, the attached drawings are included to aid in obtaining an understanding of the present invention.

As stated previously, an integrated circuit device is comprised of many thousands of transistors. An illustrative transistor 10 that may be included in such an integrated circuit device is shown in FIG. 1. The transistor 10 is generally comprised of a gate dielectric 14, a gate conductor 16, and a plurality of source/drain regions 18 formed in a semiconducting substrate 12. A plurality of sidewall spacers 20 may also be formed adjacent the gate conductor 16, and a plurality of trench isolation regions 25 may be formed in the substrate to electrically isolate the transistor 10 from other semiconductor devices. Many such transistors 10 are formed above a wafer 11.

The materials of construction for the various components of the transistor 10, as well as the techniques for making such components, may be varied as a matter of design choice. For example, the semiconducting substrate 12 may be comprised of silicon, the gate dielectric layer 14 may be comprised of silicon dioxide, and the gate conductor 16 may be comprised of polysilicon. The source/drain regions 18 may be formed by performing one or more ion implantation processes to implant the appropriate dopant atoms, arsenic for NMOS technology, boron for PMOS technology, into the semiconducting substrate 12. Moreover, the various components of the illustrative transistor 10 may be formed by a variety of known techniques, e.g., plasma enhanced chemical vapor deposition ("PECVD"), chemical vapor deposition ("CVD"), physical vapor deposition ("PVD"), thermal growing, sputtering, etc. Thus, the particular details of construction of the illustrative transistor 10 should not be considered a limitation of the present invention.

Next, as shown in FIG. 1, a layer of dielectric material 24 is formed above the transistor 10. The layer of dielectric material 24 may be comprised of a variety of materials suitable for use as an insulating layer between conductive interconnections to be formed on the integrated circuit device. For example, the layer of dielectric material 24 may be comprised of materials having a dielectric constant ("k") less than approximately 5. Such materials may include silicon dioxide, hydrogen silsesquioxane ("HSQ"), fluorinated TEOS, a carbon-doped oxide, etc. Moreover, the layer of dielectric material 24 may be formed by a variety of known techniques, e.g., deposition, thermal growth, etc. In one illustrative embodiment, the layer of dielectric material 24 is comprised of a deposited layer of silicon dioxide having a thickness ranging from approximately 2000–5000 Å.

Figure 2:
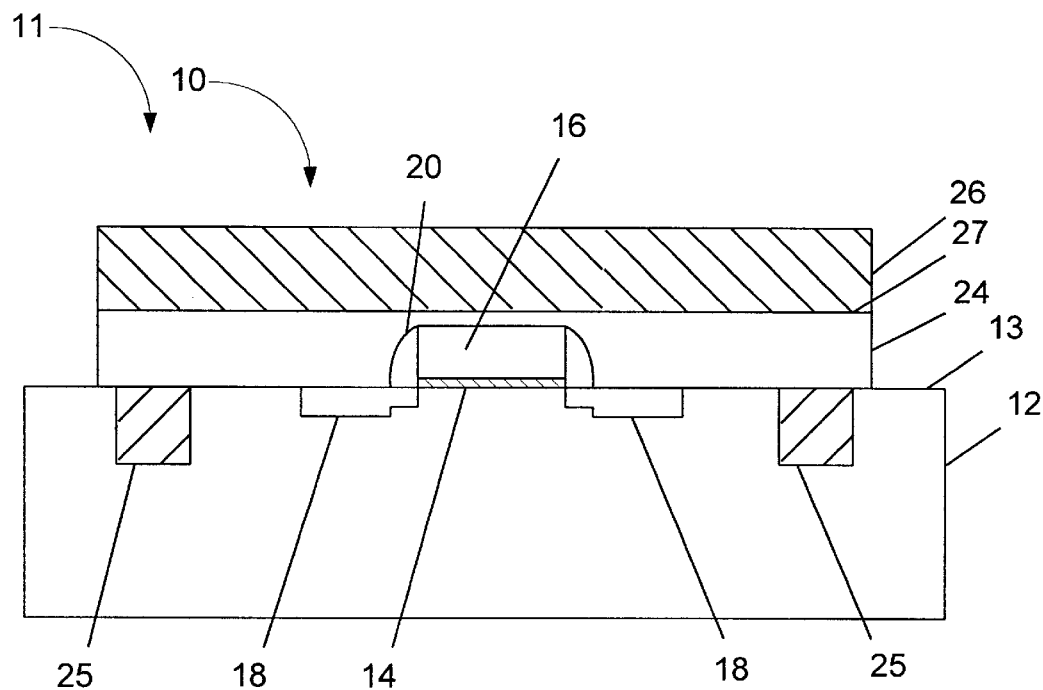
FIG. 2 is a cross-sectional view of the device depicted in FIG. 1 after a layer of photoresist has been formed thereabove.

Next, as shown in FIG. 2, a layer of photoresist 26 is formed above a surface 27 of the layer of dielectric material 24. The layer of photoresist 26 may be a positive or negative type photoresist, and it may be formed by a variety of techniques. In one illustrative embodiment, the layer of photoresist 26 is approximately 5000–8000 Å and is formed by a spin-coating process.

Figure 3:
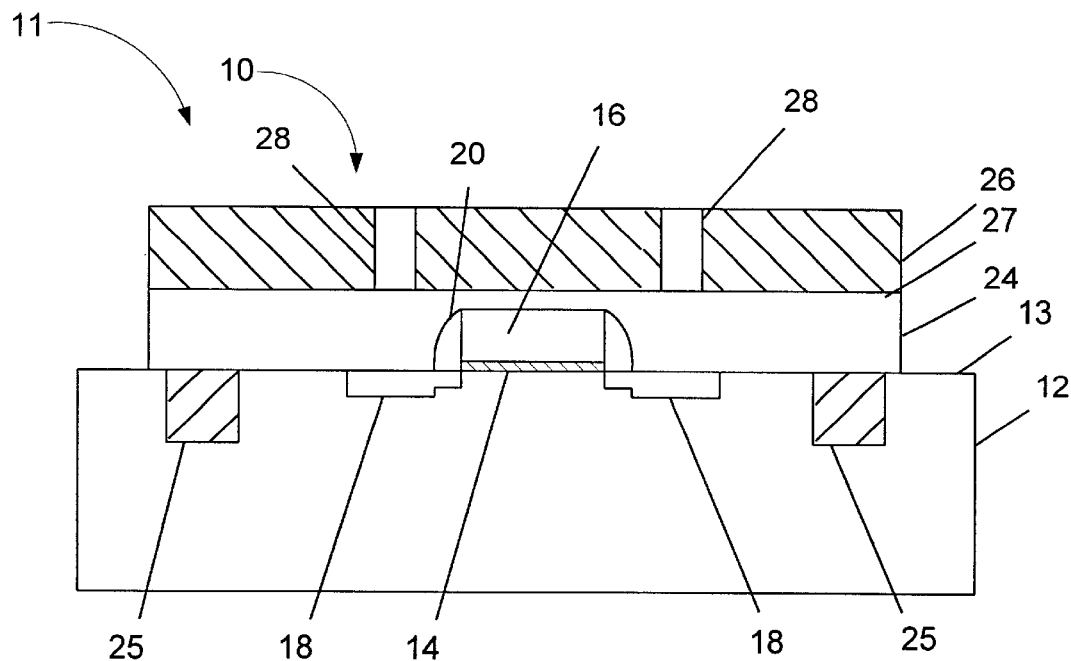
FIG. 3 is a cross-sectional view of the device shown in FIG. 2 after a plurality of features have been formed in the layer of photoresist.

Thereafter, as shown in FIG. 3, the layer of photoresist 26 is patterned using known photolithography processing techniques to define a plurality of features 28 in the layer of photoresist 26. In the illustrative embodiment depicted in FIG. 3, the features 28 are essentially circular shaped holes that will be used to define corresponding openings 30 (see FIG. 5) in the layer of dielectric material 24 for conductive interconnections yet to be formed. Of course, the particular size and shape of the features 28 may vary depending upon the desired resulting structure to be formed in the layer of dielectric material 24.

Figure 4:
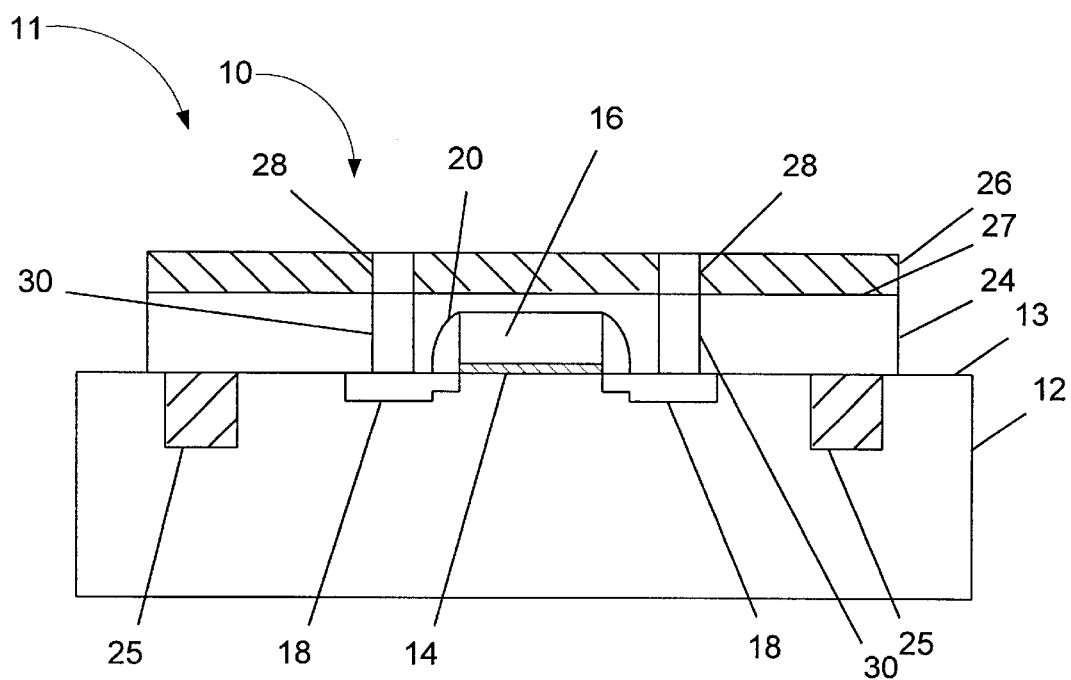
FIG. 4 is a cross-sectional view of the device shown in FIG. 3 after a plurality of openings have been formed in the layer of dielectric material.

Next, as shown in FIG. 4, one or more etching processes are used to define a plurality of openings 30 in the layer of dielectric material 24. The etching process used may be either a dry or wet etching process. In one illustrative embodiment, the etching process used to define the openings 30 is an anisotropic plasma etching process. Note that, during this etching process, the thickness of the layer of photoresist 24 may be reduced from its as formed thickness of approximately 5000–8000 Å to a thickness ranging from approximately 50–5500 Å, depending upon surface topography.

Figure 5:
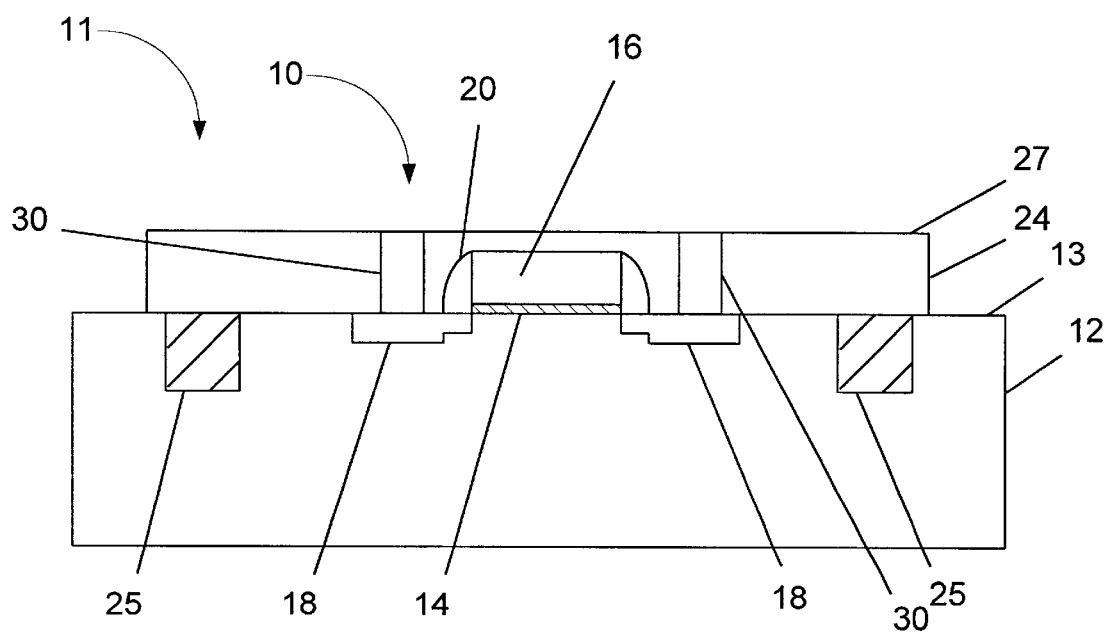
FIG. 5 is a cross-sectional view of the device shown in FIG. 4 after the layer of photoresist has been removed.

Thereafter, as shown in FIG. 5, the layer of photoresist 26 is removed so that subsequent processing operations may be performed, i.e., so that the conductive interconnections (not shown) may be formed in the openings 30 in the layer of dielectric material 24, etc. In accordance with the present invention, the layer of photoresist 24 may be removed using a polishing tool 36, as shown in FIG. 6.

Figure 6:
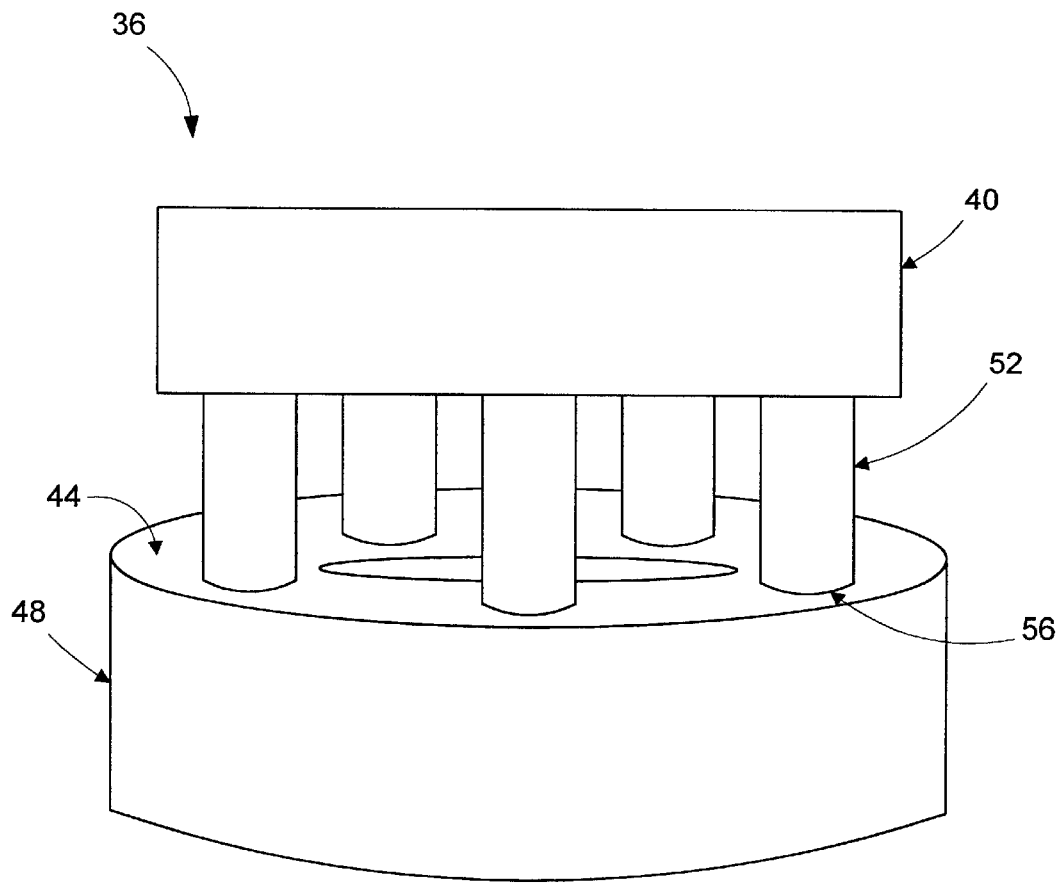
FIG. 6 is a depiction of one illustrative polishing tool that may be used with the present invention.

Referring to FIG. 6, an exemplary multiple arm polishing tool 36 is shown. The exemplary polishing tool 36 may be comprised of a multi-head carrier 40 positioned above a polishing pad 44 that is mounted on a rotatable platen 48. The polishing pad 44 may be comprised of a variety of materials, such as polyurethane. The multi-head carrier 40 typically includes a plurality of polishing arms 52, each of which includes a rotatable carrier head 56. Wafers (not shown) may be secured to the carrier heads 56 using known techniques, such as vacuum pressure. A source of fluid (not shown) may be provided to supply a fluid, such as deionized water, or a solvent (e.g., slurry) to the polishing pad 44. Furthermore, although five polishing arms 52 are shown, the polishing tool 36 may be comprised of any number of polishing arms 52. For example, in one embodiment, the polishing tool 36 is comprised of only a single polishing arm 52, and each wafer is polished individually.

In one illustrative embodiment of the present invention, the layer of photoresist 26 is removed by positioning the layer of photoresist 26 formed on the wafer 11 in contact with the polishing pad 44 of the polishing tool 36, and rotating at least one of the polishing pad 44 or the wafer 11 to remove substantially all of the layer of photoresist 26. This removal process may be accomplished either with or without a solvent or slurry solution, i.e., it may be performed used a fluid such as deionized water.

Figure 7:
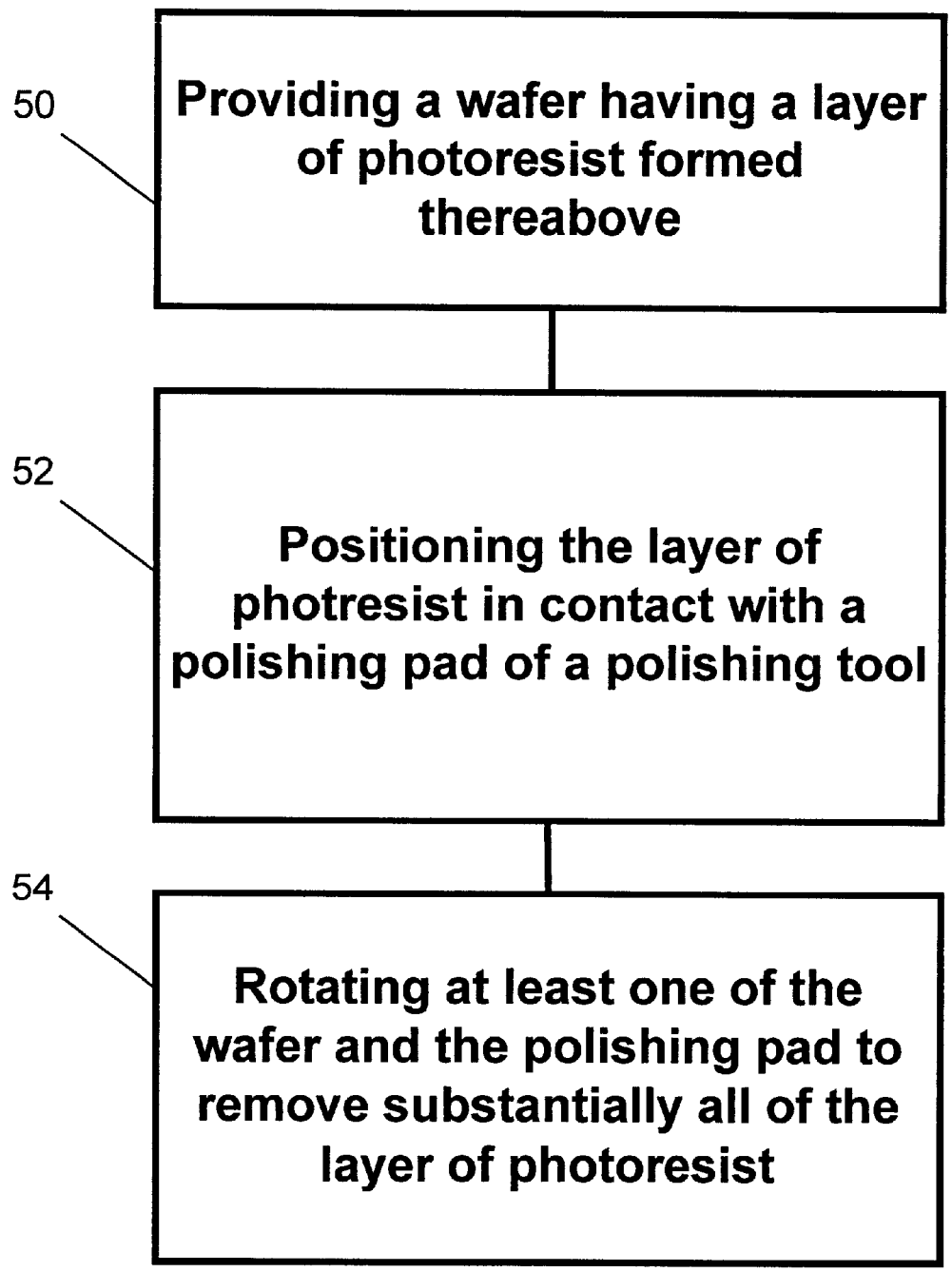
FIG. 7 is a flow depicting one illustrative embodiment of the present invention.

More particularly, one illustrative embodiment of the present invention is depicted in flowchart form in FIG. 7. As shown therein, the method comprises providing a wafer 11 having a layer of photoresist 26 formed thereon, as indicated at block 50, and positioning the layer of photoresist 26 in contact with the polishing pad 44 on the polishing tool 36, as indicated at block 52. The method further comprises rotating at least one of the wafer 11 and the polishing pad 44 to remove substantially all of the layer of photoresist 26, as indicated at block 54. If desired, both the wafer 11 and the polishing pad 44 may be rotated at the same time. Moreover, the wafer 11 may be oscillated back and forth across the polishing pad 44 during the removal operation. Other parameters, such as the down force applied by the polishing arms 52, the oscillation length of the wafer 11, as well as the rotational speed of the carrier heads 56 and/or rotating polishing pad 44, may be adjusted as desired.

As stated previously, the present invention may involve removal of the layer of photoresist 26 with or without using a separate solvent solution. That is, the layer of photoresist 26 may be removed using a fluid, such as deionized water, during the process. Alternatively, the removal of the layer of photoresist 24 may also be performed using a solvent, such as ethyl lactate, isopropyl alcohol (IPA), etc., that is applied to either the polishing pad 44 or the layer of photoresist 26, or to both. Moreover, the supply of this solvent may be on a continuous or intermittent basis. The amount of the solvent used will vary depending on the desired removal rate for the layer of photoresist 26.

After the layer of photoresist has been removed, if desired, a post-CMP scrub process may be performed to remove any remnants of the layer of photoresist 26. For example, a post-CMP scrub using deionized water, or a dilute chemical, such as hydrofluoric acid (HF), may be used. Alternatively, such scrubbing may be performed using a megasonic type scrub process.

A variety of control schemes may be used to determine when the layer of photoresist 26 has been sufficiently removed. For example, during the removal process, electrical current supplied to the rotating carrier heads 56 of the polishing tool 36 may be monitored. Because the layer of photoresist 26 and the layer of dielectric material 24 may have different coefficients of friction, the endpoint of the removal process may be determined by changes in the current supplied to the rotating carrier heads 56. For example, depending upon the coefficient of friction of the underlying layer of dielectric material 24, an increase or decrease in the current supplied to the rotating carrier heads 56 may signal the endpoint of the removal process.

To ensure the layer of photoresist 26 is completely removed from the wafer 11, a timed, over polish process may be used with the endpoint control technique described above. For example, once endpoint is determined by monitoring the current to the carrier heads 56, the removal process may be extended for a short period of time (e.g., a 30 second over polish process), and any residual materials from the layer of photoresist 26 that may be removed.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a wafer having a layer of material formed thereon, said layer of material having no openings formed therein and a surface;
   forming a patterned layer of photoresist above said surface of said layer of material;
   forming a plurality of openings in said layer of material using said patterned layer of photoresist as a mask;
   positioning said patterned layer of photoresist in contact with a polishing pad; and
   rotating at least one of said wafer and said polishing pad to remove substantially all of said patterned layer of photoresist from above said surface of said layer of material having said plurality of openings formed therein.

2. The method of claim 1, wherein positioning said patterned layer of photoresist into contact with a polishing pad comprises:
   affixing said wafer to a polishing arm of a chemical mechanical polishing tool; and
   urging said patterned layer of photoresist into contact with a polishing pad on said chemical mechanical polishing tool.

3. The method of claim 1, wherein rotating at least one of said wafer and said polishing pad to remove substantially all of said patterned layer of photoresist comprises rotating at least one of said wafer and said polishing pad to remove substantially all of said patterned layer of photoresist, said rotation being performed in the presence of a fluid comprised of deionized water.

4. The method of claim 1, wherein rotating at least one of said wafer and said polishing pad to remove substantially all of said patterned layer of photoresist comprises rotating at least one of said wafer and said polishing pad to remove substantially all of said patterned layer of photoresist, said rotation being performed in the presence of a fluid.

5. The method of claim 1, wherein rotating at least one of said wafer and said polishing pad to remove substantially all of said patterned layer of photoresist comprises rotating at least one of said wafer and said polishing pad to remove substantially all of said patterned layer of photoresist, said rotation being performed in the absence of a solvent solution.

6. The method of claim 1, wherein rotating at least one of said wafer and said polishing pad to remove substantially all of said patterned layer of photoresist comprises rotating at least one of said wafer and said polishing pad to remove substantially all of said patterned layer of photoresist, said rotation being performed in the presence of a solvent solution.

7. The method of claim 1, wherein rotating at least one of said wafer and said polishing pad to remove substantially all of said patterned layer of photoresist comprises rotating at least one of said wafer and said polishing pad to remove substantially all of said patterned layer of photoresist, said rotation being performed in the presence of a solvent solution comprised of at least one of ethyl lactate, acetone, and isopropyl alcohol (ISP).

8. The method of claim 1, wherein rotating at least one of said wafer and said polishing pad to remove substantially all of said patterned layer of photoresist comprises rotating both of said wafer and said polishing pad to remove substantially all of said patterned layer of photoresist.

9. A method, comprising:
   providing a wafer having a layer of dielectric material formed thereon, said layer of dielectric material having no openings formed therein and a surface;
   forming a patterned layer of photoresist above said surface of said layer of dielectric material;
   forming a plurality of openings in said layer of dielectric material using said patterned layer of photoresist as a mask;

affixing said wafer to a polishing arm of a chemical mechanical polishing tool;

urging said patterned layer of photoresist into contact with a polishing pad on said chemical mechanical polishing tool; and rotating at least one of said wafer and said polishing pad to remove substantially all of said layer of photoresist from above said surface of said layer of dielectric material having said plurality of openings formed therein.

10. The method of claim 9, wherein providing a wafer having a layer of dielectric material formed thereabove comprises providing a wafer having a layer of dielectric material having a dielectric constant less than approximately 5 formed thereabove.

11. The method of claim 9, wherein forming a layer of photoresist above said layer of dielectric material comprises forming a patterned layer of photoresist above said layer of dielectric material.

12. The method of claim 9, wherein rotating at least one of said wafer and said polishing pad to remove substantially all of said patterned layer of photoresist comprises rotating at least one of said wafer and said polishing pad to remove substantially all of said patterned layer of photoresist, said rotation being performed in the presence of a fluid comprised of deionized water.

13. The method of claim 9, wherein rotating at least one of said wafer and said polishing pad to remove substantially all of said patterned layer of photoresist comprises rotating at least one of said wafer and said polishing pad to remove substantially all of said patterned layer of photoresist, said rotation being performed in the presence of a fluid.

14. The method of claim 9, wherein rotating at least one of said wafer and said polishing pad to remove substantially all of said patterned layer of photoresist comprises rotating at least one of said wafer and said polishing pad to remove substantially all of said patterned layer of photoresist, said rotation being performed in the absence of a solvent solution.

15. The method of claim 9, wherein rotating at least one of said wafer and said polishing pad to remove substantially all of said patterned layer of photoresist comprises rotating at least one of said wafer and said polishing pad to remove substantially all of said patterned layer of photoresist, said rotation being performed in the presence of a solvent solution.

16. The method of claim 9, wherein rotating at least one of said wafer and said polishing pad to remove substantially all of said patterned layer of photoresist comprises rotating at least one of said wafer and said polishing pad to remove substantially all of said patterned layer of photoresist, said rotation being performed in the presence of a solvent solution comprised of at least one of ethyl lactate, acetone, and isopropyl alcohol (ISP).

17. The method of claim 9, wherein rotating at least one of said wafer and said polishing pad to remove substantially all of said patterned layer of photoresist comprises rotating both of said wafer and said polishing pad to remove substantially all of said patterned layer of photoresist.

* * * * *